MICRO-MINIATURE ELECTRONIC COMPONENTS BY DOUBLE REJECTION

MICRO-MINIATURE ELECTRONIC COMPONENTS BY DOUBLE REJECTION

Filed June 20, 1972 2 Sheets-Sheet 2

United States Patent Office 3,799,777
Patented Mar. 26, 1974

3,799,777

MICRO-MINIATURE ELECTRONIC COMPONENTS BY DOUBLE REJECTION

Terence W. O'Keeffe, Pittsburgh, and Jerome R. Morris, Trafford, Pa., assignors to Westinghouse Electric Corporation, Pittsburgh, Pa.

Filed June 20, 1972, Ser. No. 264,662
Int. Cl. G03c 5/00
U.S. Cl. 96—36.2 10 Claims

ABSTRACT OF THE DISCLOSURE

A micro-miniature electronic component and particularly an electromask of high resolution is made by defining, preferably with an electron beam, a component pattern in a radiation sensitive soluble layer preferably directly laid on a substrate surface, and thereafter transferring the pattern to a component layer on the substrate surface by sequentially rejecting and removing: (i) irradiated or unirradiated portions of the radiation sensitive layer to leave a radiation sensitive layer in a first defined pattern, (ii) portions of an etchant resistant layer overlaid on the radiation sensitive layer in the first defined pattern, and (iii) portions of first etchable and second etchant resistant layer in a pedestal cross-section and a second defined pattern, i.e. the negative of first defined pattern, overlaid directly on the substrate. The double rejection techniques leaves an etchant resistant component layer in the component pattern or its negative on the substrate.

GOVERNMENT CONTRACT

This invention was made in the course of or under United States Government Contract No. F 30602–69–C–0280.

FIELD OF THE INVENTION

This invention relates to the making of semiconductor devices, integrated circuits and other microminiature electronic components by processing a component layer or body through openings or windows in a radiation sensitive layer of a defined planar pattern.

BACKGROUND OF THE INVENTION

The production of a micro-miniature electronic component requires the formation of very accurately dimensioned component patterns in layers on a substrate or in a semiconductor body. The standard production method is to irradiate portions of a radiation sensitive layer overlaid on a component layer or body to define in the sensitive layer a pattern of differential solubility. The sensitive layer is then developed to remove either the irradiated or unirradiated portions of the sensitive layer and leave the sensitive layer in the negative of the desired component pattern. The component layer or body is then processed through the openings or windows in the radiation sensitive layer, e.g. by etching or deposition.

To obtain highly accurate electronic components, high resolution must be attained in defining the solubility pattern in the radiation sensitive layer. The available radiation sensitive materials with high resolution capabilities have positive sensitivity, i.e. the irradiated portions are more soluble in the developer than the unirradiated portions. The difficulty is that the negatively sensitive materials, being more radiation sensitive, react to the scattered or fringe radiation at the periphery of the radiation beam and, involving the initiation of omnidirectional cross-linking and polymerization, react irregularly along the boundary of the defined pattern. Use of the positively sensitive materials in the standard techniques generally requires irradiation of the negative of the desired pattern which is usually the larger portion of the radiation sensitive layer.

In addition, the defined pattern in differential solubility as defined in the radiation sensitive layer must be transferred to the component layer with high resolution to obtain highly accurate micro-electronic components. However, in at least some situations this cannot be done by the standard etching techniques. The etching proceeds at such a high rate that the undercut of the sensitive layer cannot be reliably controlled. Further, variations in window dimensions with thickness of the radiation sensitive layer leads to substantive inaccuracies in transfer.

These problems are particularly acute in making micro-miniature electronic components of micron size dimensions. Accuracies in the submicron range are required. Such micro-miniature electronic components cannot be made by standard photolithographic techniques because of the lack of resolution of those techniques. The electron image projection system provides for the production of pattern of high resolution in micro-miniature electronics equipment. The system is described in United States applications Ser. Nos. 753,373, now abandoned and 869,229, now Pat. No. 3,679,497, filed Aug. 19, 1968 and Oct. 24, 1969, respectively, and assigned to the same assignee as the present application. The problem is that the resolution of the projection system can be no better than the resolution of the pattern on the electromask.

The "electromask" designates the pattern-bearing photocathode of an electron image projection system. The electromask is analogous with the "photomask" applied to the typically glass or quartz plate which contains the device pattern or its negative for use in the well-known photolithographic techniques for making substantially planar electronic devices. The electromask usually contains the device patterns at full scale which are repeated in radiation opaque material over the surface of a radiation transparent, typically quartz substrate. The photocathode material is typically a thin film (e.g. 40 A.) of palladium coated overlaying the entire working area of the electromask, see e.g. U.S. Pats. Nos. 3,585,433 and 3,588,570.

A single electron beam of fine dimensions can be used to define the needed high resolution patterns in a radiation sensitive layer for making an electromask or other micro-miniature electronic component, see previously cited United States application Ser. No. 869,229. The single beam exposure of patterns over relatively large areas (e.g. 2 to 3 square inches) is however relatively slow and commercially limiting. It is highly desirable if not essential to reduce as much as possible the area to be exposed. Yet, the negative of the desired component pattern which usually must be irradiated with positively sensitive material is typically 80 to 90% of the total area of the pattern.

Moreover, the most useful material known to mask the typical photocathode is titanium dioxide. Even in thin films, titanium dioxide is opaque to the ultraviolet radiation which is normally used to activate the photocathode material. This however requires formation and etching of a titanium layer, and chemical etching of thin titanium layers is extremely unreliable. A pattern in a radiation sensitive layer produced by a single electron beam cannot therefore be directly transferred to a titanium layer with the requisite degree of precision by chemical etching. The etchant rapidly undercuts the radiation sensitive layer so that the pattern in the sensitive layer cannot be accurately transferred in the etched pattern in the titanium layer. Sputter etching and ion beam etching techniques have been found to provide higher resolution in the transfer of the radiation sensitive pattern to the metal layer. However, these techniques present problems in controlling etching rates, maintaining the integrity of the unexposed radiation sensitive layer, and/or subsequent removal of the unirradiated sensitive layer.

The present invention overcomes these difficulties and problems. It provides for the making of very accurate micro-miniature electronic components while irradiating only the positive of the pattern and employing chemical means.

SUMMARY OF THE INVENTION

Micro-miniature electronic components and particularly electromasks are made with accuracy in the submicron range. A radiation sensitive layer is formed on a surface of a substrate or a substrate over which is applied a first etchable layer. A desired component pattern or the negative thereof is formed in the radiation sensitive layer preferably by movement of a single electron beam through a matrix of the desired pattern. A developer is then used to remove irradiated or unirradiated portions of the sensitive layer to expose parts of the surface on the substrate or the etchable layer. The portion removed by developing is preferably the irradiated portion of the radiation sensitive layer where available high resolution positively sensitive materials are used.

Thereafter, an etchable first layer is applied preferably by evaporation or sputtering where the first layer is not applied prior to application of the radiation sensitive layer. If the first layer is applied at this time, it is applied to overlay preferably all of the remaining sensitive layers as well as all portions of the exposed surface of the substrate which the sensitive layer does not overhang. Preferably the radiation sensitive layer overhangs portions of the substrate surface so that the first layer does not intimately contact the sensitive layer.

An etchant resistant second layer is then applied preferably by evaporation or sputtering to the first layer. If the first layer is applied after formation of the defined pattern in the radiation sensitive layer, the second layer is applied so that the combined thickness of the first and second layers is less than the radiation sensitive layer. On the other hand, if the first layer is applied before application of the sensitive layer, the second layer is applied to overlay preferably all of the remaining sensitive layers as well as all portions of the exposed surface of the first layer which the sensitive layer does not overhang. Its thickness is less than the thickness of the sensitive layer. Preferably the second layer is made substantially etchant resistant after its application by for example oxidation.

Thereafter, the patterned radiation sensitive layer is removed preferably by dissolving in a suitable solvent. The second layer and any first layer overlaying the sensitive layer is rejected and removed, along with the remaining sensitive layer, to expose parts of the surface of the substrate or of the first layer. Thereafter the first layer is partially etched with a suitable etchant to which the second layer, and preferably the substrate, is resistant to undercut the second layer and form a pedestal shape from the first and second layers.

An etchant resistant third layer is then applied preferably by evaporation or sputtering to the second layer as well as portions of the substrate surface which the second layer does not overhang. The thickness of the third layer is less than the thickness of the first layer. Because of the pedestal shape of the first and second layers, the third layer does not come into intimate contact with the first layer. Thereafter the first layer is removed by etching, and the second and third layers overlaid are simultaneously rejected and removed along with the first layer.

The result is the transfer of the high resolution pattern defined in the radiation sensitive layer to the third layer applied directly on the substrate surface. Other details, objects and advantages of the invention will become apparent as the following description of the present preferred embodiments of and present preferred method of practicing the same proceeds.

BRIEF DESCRIPTION OF THE DRAWINGS

In the accompanying drawings, the present preferred embodiments of the invention and the present preferred methods of practicing the invention are illustrated in which.

DESCRIPTION OF THE PREFERRED EMBODIMENTS

Figure 1:
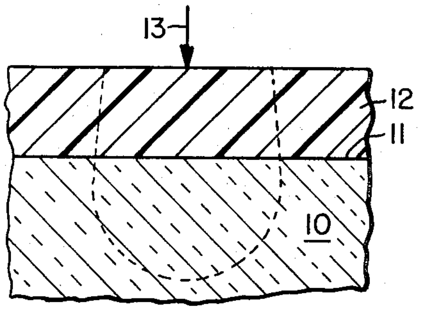
FIGS. 1 through 8 are fragmentary cross-sectional views in elevation of a micro-miniature electronic component such as an electromask at various stages of manufacture by a double rejection method.

Referring to the drawings, substrate 10 such as a glass fiber reinforced polyester circuit board or semiconductor body or wafer is provided for a desired semiconductor device or other micro-miniature electronic component. For an electromask, the substrate is a material substantially transparent to ultraviolet radiation such as quartz.

Substrate 10 has a major surface 11 of planar shape over which a suitable radiation sensitive layer 12 is applied. For definition by an electron beam, the sensitive layer may be made of any of the various commercially available positive "photoresist" materials that respond to electron bombardment to become soluble in developer, such as AZ–1350 and AZ–1350H made by Shipley and Microline PR–102 made by GAF. Preferably the radiation sensitive material consists of homo- or co-polymers of acrylic or methacrylic acids or esters and most desirably having polar side groups. Such radiation sensitive materials become soluble to common organic solvents upon irradiation by an electron beam.

The thickness of sensitive layer 12 is also important to the definition of the pattern formed in it. The thickness of sensitive layer 12 must be on the order of the resolution desired in the pattern. Typically, the thickness will be between about 0.2 and 1.0 micron. If the desired resolution is 0.1 micron, then the sensitive layer need be on the order of 0.5 micron or less.

Figure 2:
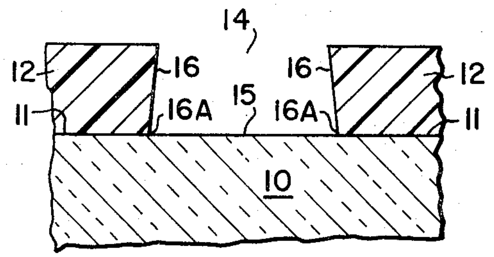

The radiation sensitive layer 12 is irradiated by a single electron beam 13 of fine dimensions. The position of beam 13 is sequentially moved on command from a computer over the radiation sensitive layer to irradiate and define the positive of the desired pattern in the sensitive layer. The path of the beam is recorded in the radiation sensitive layer by a differential in solubility. It should also be noted that the electron beam disperses as it enters the sensitive layer. This dispersion causes the edge of the sensitive layer to have a reentrant or overhang profile (as shown in FIG. 2) after it is developed. Although not limiting, this overhang profile is important to achieving high resolution by the double rejection technique.

In some cases, a metal layer (not shown), such as aluminum typically between 50 and 500 angstroms (e.g. 300 A.) in thickness, is preferably laid over sensitive layer 12 prior to irradiation by the electron beam 13. This overlayer reduces or eliminates charge build-up on substrate 10 during electron-beam exposure. It must, however, be thin enough to allow the electron beam through the metal layer without substantial electron scatter. Otherwise the resolution of the single electron beam technique will be lost. Such metal layer is subsequently removed by standard etching techniques before the radiation sensitive layer is developed.

Referring to FIG. 2, the irradiated radiation sensitive layer 12 is developed to form window 14 in layer 12 and expose portions 15 of major surface 11 of substrate 10. The developer suitable for use will vary with the composition of radiation sensitive layer. Some suitable developers for the acrylate and methacrylate radiation sensitive materials are alcohols, ketones and mixtures thereof. The edge portions 16 of window 14 have a reentrant or overhang profile so that the bases 16A of the edge portions 16 are well protected and do not intimately contact deposited metal. As a result, high resolution is assured by the double rejection technique as hereinafter explained.

Figure 3:
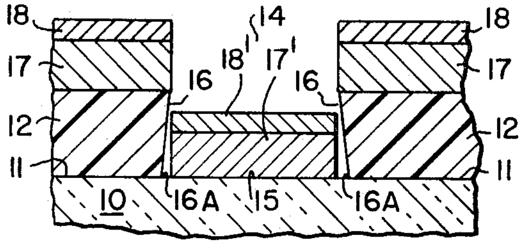
Figure 3A:
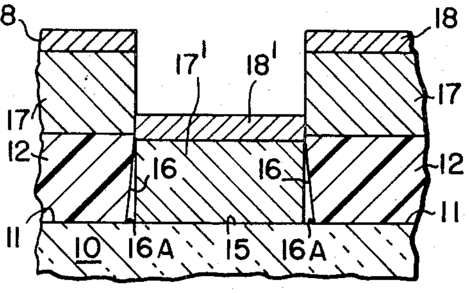

Referring to FIGS. 3 and 3A, first layers 17 and 17' are simultaneously deposited preferably by evaporation or sputtering over the entire surface of the substrate 10. Layer 17 is deposited over all portions of remaining sensitive layer 12, and layer 17' is deposited on all portions of exposed surface portion 15 of substrate 10 which are not overhung by edge portions 16. Because of the overhang of edge portions 16 of window 14, layer 17' is not in intimate contact with layer 12. Any etchable material may be appropriate for deposition as layers 17 and 17' depending on the chemistry. Typically, the etchable material will be a Group I–B, III–B, VI–B, VI–A or VIII metal such as silver, gold, platinum, nickel, palladium or tungsten. Preferably, however, aluminum, gold or silicon is used for layers 17 and 17' because of its deposition uniformity and subsequent etchability.

Second layers 18 and 18' are simultaneously deposited preferably by evaporation or sputtering over first layers 17 and 17'. Layer 18 overlays layer 17 on the radiation sensitive layer 12, and layer 18' overlays layer 17' on exposed surface portions 15 of substrate 10. Edge portions 16 protect overhung surface portions adjacent bases 16A from being contacted with layer 18. Layers 18 and 18' may be of any suitable material which is etchant resistant or may be processed to be an etchant resistant. Preferably titanium is used for second layers 18 and 18'; but other materials such as chromium may be appropriate in some embodiments.

The thickness of layers 17–17' and layers 18–18' must be controlled to enable the subsequent rejection technique to be performed. The combined thickness of the layers cannot exceed the thickness of sensitive layer 12. FIG. 3 shows the deposition to be of proper thickness, while FIG. 3A illustrates what happens if the layers are too thick. As FIG. 3A shows, edge portions 16 of window 14 in layer 12 are completely buried so that the radiation sensitive material cannot be attacked without also attacking the layers 17–17' and 18–18'. For efficient attack on the radiation sensitive material and subsequent good rejection of layers 17 and 18, the combined thickness of layers 17 and 18 should be less than 80% of thickness of layer 12. Further the first layer 17 must be thicker than the thickness of the third layers 21–21' as hereafter described. Typically first layer 17–17' is 1200 angstroms in thickness, and second layer 18–18' is 165 angstroms in thickness.

Figure 4:
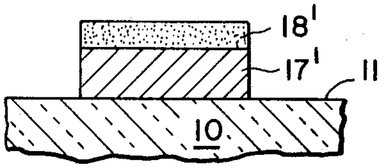

Referring to FIG. 4, layers 17 and 18 are rejected along with the removal of radiation sensitive layer 12. The irradiated radiation sensitive material is dissolved by a suitable solvent such as trichloroethylene or ketone. This step is less troublesome if there is prolonged soaking in the solvent. Also agitation and/or light brushing with a soft brush is often beneficial at this step.

If layer 18 is of a material such as a titanium, layer 18 is thereafter oxidized to form an etchant resistant layer. A titanium layer of typical thickness (e.g. 165 angstroms) can be fully oxidized by heating in an oxygen-rich atmosphere at 400° C. for about 3 hours.

Figure 5:
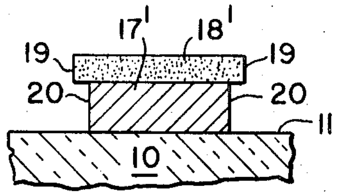

Referring to FIG. 5, first layer 17' is partially etched with an etchant to which second layer 18' and preferably substrate 10 are substantially resistant. The result is an undercut of first layer 17' to form the pedestal shape, as shown in FIG. 5, where the edge portions 19 of layer 18' extend beyond the edge portions 20 of layer 17'. The etchant used in this step will vary with the compositions of the substrate and first and second layers. For a first layer 17' of aluminum and a second layer 18' of titanium, a typical recipe for the etchant is 10% aqueous solution of sodium hydroxide. The 10% sodium hydroxide solution will etch the titanium dioxide but not at a significant rate. Typically this etching step is performed by immersion in the hydroxide solution for about one minute.

Figure 6:
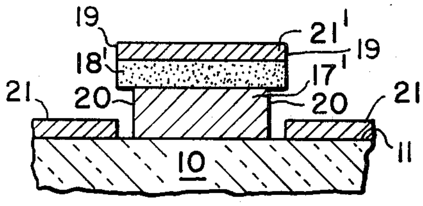

Referring to FIG. 6, third layers 21 and 21', of a desired pattern material, are simultaneously deposited over the entire substrate 10 preferably by evaporation or sputtering. Layer 21 is deposited directly on the substrate, while layer 21' is deposited over layer 18'. For an electromask, any etchant resistant material is suitable which is opaque to photocathode exciting radiation. Since typically ultraviolet radiation is used for electron emission in an electromask, titanium is preferred for deposition as third layers 21–21' and subsequently converted to titanium dioxide by oxidation.

Because of the pedestal shape, layer 21 does not come into intimate contact with layer 17'. To the contrary, the partial etch of layer 17' provides that layer 21 is spaced from layer 17'. As a result, the high resolution of the original electron-beam pattern defined in radiation sensitive layer 12 is maintained through the second rejection step.

The thickness of third layers 21–21' may be any suitable thickness less than the thickness of layer 17'. If it is thicker than layer 17' , layer 17' is buried and cannot be attacked to perform the second rejection step. Preferably, the thickness of third layers 21 and 21' is less than 80% of the thickness of layer 17' and is typically about 400 angstroms to allow for efficient attack of layer 17'.

Figure 7:
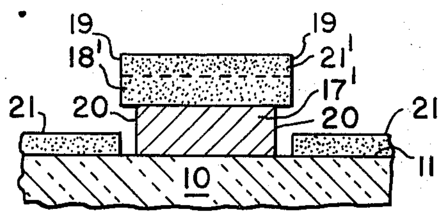

Referring to FIG. 7, layers 21 and 21' of, for example, titanium is oxidized to form an etchant resistant layer. Typically, a titanium layer of about 400 angstroms can be fully oxidized by heating in an oxygen-rich atmosphere at 400° C. for between 12 and 24 hours.

If titanium is used to form layers 21 and 21', it is important that the titanium is oxidized before etching. Although titanium may not be attacked significantly by the etchant, e.g. 10% sodium hydroxide solution, the electrochemical couple which may be produced by the titanium in proximity with layer 17' (e.g. aluminum) causes the etching rate and in turn the rejection step to proceed uncontrollably. With oxidation of the titanium metal, the electro-chemical couple cannot form and the etching step proceeds with good control.

Figure 8:
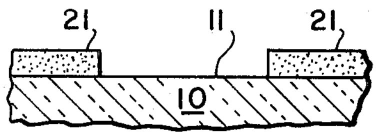
Figure 9:
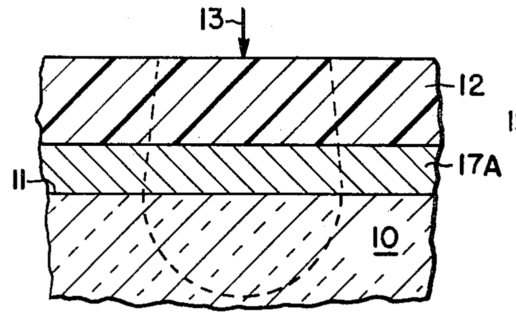
FIGS. 9 through 16 are fragmentary cross-sectional views in elevation of a micro-miniature electronic compoponent such as an electromask at stages of manufacture by an alternative double rejection method.
Figure 10:
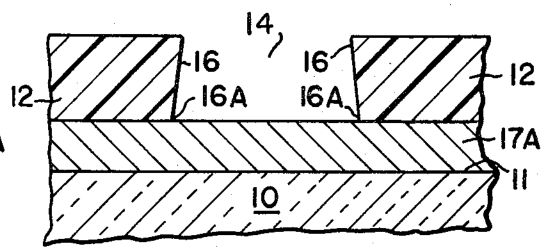
Figure 11:
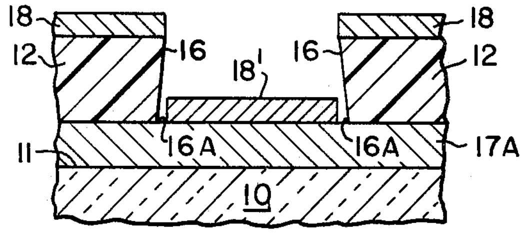
Figure 12:
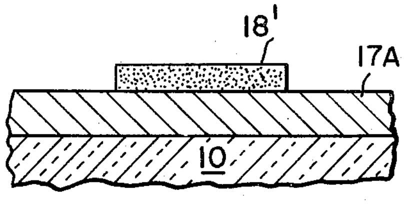
Figure 13:
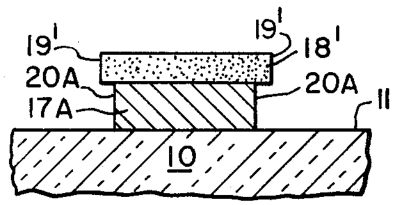
Figure 14:
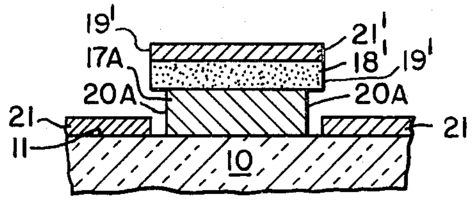
Figure 15:
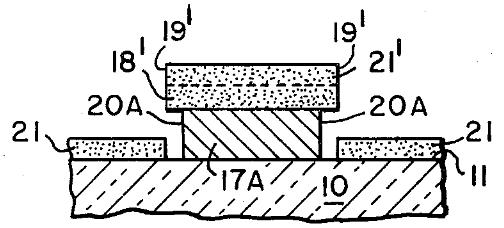
Figure 16:
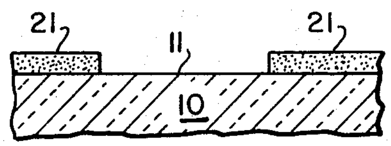

Referring to FIG. 8, the micro-miniature component is formed by removal of layers 17', 18' and 21' by etching layer 17' with an etchant to which layer 21 is resistant. Layers 18' and 21' are rejected in the etching step. An etchant suitable for this step will vary with the composition of substrate 10, layer 17' and layer 21 and is typically the same etchant previously used to partially etch layer 17' to form the pedestal shape.

After formation of the micro-miniature component by use of the double rejection technique, other manufacturing steps may be performed. For example, to make an electromask, a photocathode layer of for example palladium, gold, platinum, aluminum, barium, copper or cesium iodide, will be formed over the entire workpiece.

An alternative double rejection technique for making a micro-miniature electronic component is illustrated in FIGS. 9 through 16. The compositions, dimensions and steps are the same as previously described in the double rejection technique illustrated in FIGS. 1 through 8 except that the first layer is deposited on substrate 10 as a continuous layer before the radiation sensitive layer is applied. As a result, layer 18 without layer 17A is rejected during the first rejection step. The negative pattern of layer 17A is removed during the partial etch in the formation of the pedestal shape (see FIGS. 12 and 13).

However, this latter alternative double rejection technique is not preferred with certain compositions for layers 17A and 18–18'. For example, if layer 17A is aluminum, and layer 18–18' is titanium, the partial etching to form the pedestal shape is difficult to perform. If the step is carried out without prior oxidation of the titanium, massive rapid undercutting of the titanium is liable to occur due to the electro-chemical couple present between the titanium and aluminum. On the other hand, if the titanium is oxidized to titanium dioxide prior to etching to prevent the electro-chemical couple, hillock and whisker growth on the aluminum layer prevents complete aluminum removal from the substrate during the subsequent second rejection step. Such whiskers and hillocks may grow to 10 microns or more in size during the oxidation of a 165 angstrom titanium layer. Such features shadow the final, third layer 21 and cause pinholes to form in it.

The alternative double rejection technique for making a micro-miniature electronic component may however be fully equivalent with certain compositions for first layer 17A. Notably, gold does not show the same hillock and whisker growth as aluminum and therefore does not present the shadowing problem. It is contemplated therefore that although gold has poor adhesion to quartz, high resolution micro-miniature electronic components such as electromasks may be produced by the alternative double rejection technique shown in FIGS. 9 through 16 by use of gold.

While the presented preferred embodiments of the invention and methods of performing them have been specifically described, it is distinctly understood that the invention may be otherwise variously embodied and used.

What is claimed is:

1. A method for making a micro-miniature electronic component comprising the steps of:

(a) defining a differential solubility pattern in a radiation sensitive layer on a surface of a substrate;

(b) developing the radiation sensitive layer to expose first parts of the surface of the substrate and to leave parts of the sensitive layer defining the differential solubility pattern;

(c) applying an etchable first layer and an etchant resistant second layer having a combined thickness less than the radiation sensitive layer to at least portions of the exposed first parts of the surface and to at least portions of the sensitive layer;

(d) removing the portions of the first and second layers overlaying the patterned parts of the radiation sensitive layer to expose second parts of the surface of the substrate;

(e) partially etching the first layer with an etchant to which the second layer is substantially resistant to undercut the second layer and to form a pedestal shape of the first and second layers;

(f) applying an etchant resistant third layer having a thickness less than the first layer to the second layer and to at least portions of the exposed second surfaces of the surface of the substrate; and (g) removing the first layer together with the portions of the second and third layers applied to the first layer with an etchant to which the second and third layers is substantially etchant to transfer the pattern defined in the radiation sensitive layer to the third layer applied to the surface of the substrate.

2. A method for making a micro-miniature electronic component as set forth in claim 1 wherein: the pattern is defined in the radiation sensitive layer by an electron beam.

3. A method for making a micro-miniature electronic component as set forth in claim 1 wherein: the second and third layers are made etchant resistant after application by oxidation of the layers.

4. A method for making a micro-miniature electronic component as set forth in claim 3 wherein: the second and third layers are titanium.

5. A method for making a micro-miniature electronic component as set forth in claim 4 wherein: the first layer is aluminum.

6. A method for making a micro-miniature electronic component comprising the steps of:

(a) applying an etchable first layer to a surface of a substrate and a radiation sensitive layer thereover;

(b) defining a pattern in the radiation sensitive layer by differential solubility;

(c) developing the defined pattern to expose first parts of the surface of the first layer and to leave patterned parts of the radiation sensitive layer;

(d) applying an etchant resistant second layer having a thickness less than the radiation sensitive layer to at least portions of the exposed first parts of the first layer and to at least portions of the radiation sensitive layer;

(e) removing the portions of the second layer overlaying the patterned parts of the radiation sensitive layer to expose second parts of the surface of the first layer;

(f) partially etching the first layer with an etchant to which the second layer is substantially resistant to undercut the second layer and form a pedestal shape of the first and second layers;

(g) applying an etchant resistant third layer having a thickness less than the first layer to the second layer and to at least portions of the exposed second surfaces of the surface of the substrate; and (h) removing the first layer together with the portions of the second and third layers applied to the first layer with an etchant to which the second and third layers is substantially etchant to transfer the pattern defined in the radiation sensitive layer to the third layer applied to the surface of the substrate.

7. A method for making a micro-miniature electronic component as set forth in claim 6 wherein: the pattern is defined in the radiation sensitive layer by an electron beam.

8. A method for making a micro-miniature electronic component as set forth in claim 6 wherein: the second and third layers are made etchant resistant after application by oxidation of the layer.

9. A method for making a micro-miniature electronic component as set forth in claim 8 wherein: the second and third layers are titanium.

10. A method for making a micro-miniature electronic component as set forth in claim 9 wherein the first layer is gold.

References Cited

UNITED STATES PATENTS

| | | | |
|---|---|---|---|
| 3,679,497 | 7/1972 | Handy et al. | 156—2 |
| 3,649,392 | 3/1972 | Schneck | 96—36.2 |
| 3,669,661 | 6/1972 | Page et al. | 96—36.2 |
| 3,673,018 | 6/1972 | Dingwall | 96—36.2 |
| 3,585,433 | 6/1971 | O'Keeffe | 117—5.5 |
| 3,588,570 | 6/1971 | O'Keeffe | 117—5.5 |

J. TRAVIS BROWN, Primary Examiner

E. C. KIMLIN, Assistant Examiner

U.S. Cl. X.R.

96—36, 38.4; 156—2, 6, 8